United States Patent
Gordon et al.

[11] Patent Number: 5,897,108
[45] Date of Patent: Apr. 27, 1999

[54] SUBSTRATE SUPPORT SYSTEM

[76] Inventors: Thomas A. Gordon, 12044 Rue Des Amis, San Diego, Calif. 92131; Douglas Farlow; Kathleen Farlow, both of 11873 Calle Parral, San Diego, Calif. 92128

[21] Appl. No.: 09/012,977

[22] Filed: Jan. 26, 1998

[51] Int. Cl.$^6$ ........................................... B23Q 1/00
[52] U.S. Cl. ............................ 269/50; 269/53; 269/903; 269/310
[58] Field of Search .................... 269/50, 53, 69, 269/289 R, 309, 310, 305, 903, 239

[56] References Cited

U.S. PATENT DOCUMENTS

| | | | |
|---|---|---|---|
| 2,355,643 | 8/1944 | Grover | 269/53 |
| 3,462,219 | 8/1969 | Gunn | 269/63 |
| 5,692,286 | 12/1997 | Barthelemy | 269/53 |

Primary Examiner—Timothy V. Eley
Assistant Examiner—Lee Wilson
Attorney, Agent, or Firm—Frank D. Gilliam; John R. Duncan

[57] ABSTRACT

An apparatus for supporting a substrate such as a printed circuit board (PCB) having various electronic components installed on one side with that side down so that other components can be installed on the opposite side. An assembly of three perforated plates has deformable, typically rubber-like, pins projecting through the perforations. Springs below the assembly bias the pins to a position extending above the plate. When a PCB is laid on the pins with mounted electronic components downward, the components with pres the pins down distances corresponding to component thickness. The pins provide uniform support while working on the opposite side. The center perforated plate of the three is moved to the side, clamping the pins in position, so that the PCB can be removed and replaced with another identical PCB. Different devices for causing the plate clamping action and devices for indexing PCB position and for maintaining the PCB flat and level are also provided.

18 Claims, 4 Drawing Sheets

SUBSTRATE SUPPORT SYSTEM

FIELD OF THE INVENTION

This invention relates to apparatus for supporting a printed circuit board or other substrate typically having components mounted on one side during installation of other components on the opposite side.

BACKGROUND OF THE INVENTION

Printed circuit boards (PCB) have long been used as the base for sophisticated electronic systems. An electrically insulating sheet, originally phenolic impregnated fabrics and now generally fiberglass reinforced resins, is coated with copper cladding and has appropriate patterns etched into the cladding. In years past, most electronic components had wire leads that extended through holes drilled into the cladding pattern and filled with solder to make the required connections. More recently, surface bonding of relatively short leads to the cladding has become common, allowing for thigh speed robotic placement of components.

Today, electronic devices are increasing miniaturized and it has become desirable to mount component on both sides of a PCB. However, there are a number of problems in installing parts on the second side after components have been mounted on the first side. The board cannot be held flat with downwardly projecting components of various sizes and thicknesses mounted on the lower side. This problem is most acute when solder paste is to be printed on the second side. Holding the PCB flat and level under a paste application stencil during solder paste application and then during component placement is very difficult.

In high production run circumstances, aluminum plates or similar material have been machined out in a pattern corresponding to the topography of the first side of the PCB with components installed. This approach is not practical for manufactures or subcontractor producing a limited quantity of a very great number of PCB configurations, each requiring its own "hogged-out" support plate.

Supports have also been made by casting a plaster like material into a mold corresponding to a particular PCB to form a support having pockets for receiving the components on the downwardly extending board side.

While effective where a large number of identical boards are to be manufactured, these methods are not cost effective where only a few boards are to be made or where custom boards are being manufactured.

A number of different devices having a plurality of adjustable length upstanding fingers have been developed to support irregularly shaped article. Typical of these is the device for supporting parts during machining as described by Barozzi in U.S. Pat. No. 4,936,560, the casting support device describe by Godding in U.S. Pat. No. 4,200,272, and the core support system described by Bourassa et al. in the U.S. Pat. No. 3,530,994.

While these supports are generally effective for their intended purposes, they are overly complex, and do not always provide positive support across the supported object.

A circuit board support system using a plurality of space, parallel, upwardly extending piston is described by Fadiga et al. in U.S. Pat. No. 3,942,778. This support is used to press the back of the boards against test sensors. Since the pistons are not lockable to match a particular PCB, each succeeding board must be pressed down against the positions, risking damage. Further, the system is not readily useful in installing components on the back of the board, since the pistons continue to press upwardly so that the board may not lie truly flat and may move during back side component installation.

Thus, there is a continuing need for improved supports for holding a substrate such as a printed circuit board having components mounted on one side while additional components are installed on the opposite side, that will support the board in a precisely level position, that will provide strong, consistent support for the board during second surface Stencil printing and soldering operations, that can easily be locked in the support position appropriate to a series of similarly configured boards, that precisely indexes board edges and that is easily unlocked and reconfigured for other boards.

SUMMARY OF THE INVENTION

The above noted problems are overcome, and advantages achieved by a substrate support system basically comprising a base plate assembly and an upper plate assembly. The base plate assembly may comprise a sandwich of an imperforate plate overlaid by a plate having a pattern of apertures or a single plate having recesses machined in the pattern. An elastically compressible element is placed in at least some of the base plate assembly apertures or recesses.

The upper plate assembly comprises a sandwich of four plates each having a pattern of apertures corresponding to said base plate assembly apertures. The apertures in the first of the four plates in the upper plate assembly preferably have diameters corresponding to the base plate assembly apertures. Each of the second, third and fourth plates in the upper plate assembly has a plurality of apertures of substantially equal diameter in a pattern corresponding to said base plate assembly apertures, generally of smaller diameter than the base plate assembly apertures. The third plate is relatively movable along the contiguous faces of said second and fourth plates.

A plurality of pins formed from a slightly deformable material, such as a rubber type material, preferably having a hardness in the 75 to 90 range on the Shore A scale, are provided for insertion in selected ones of apertures through said first, second and third plates into engagement with said elastic members in said base plate assembly apertures. Alternatively, the pins may be formed from a harder material such as nylon, preferably with radial or longitudinal serrations to increase friction when pressed against a hole.

The upper plate assembly is positioned over the base plate assembly with all apertures aligned. Pins are placed in selected apertures and a printed circuit board having components mounted on a first surface is placed on said pins with the components against the pins. Pins are pressed into the apertures against the elastically compressible members a distance corresponding to the thickness of the component in contact with the pins. The third plate is moved slightly transversely so that a side of the third plate apertures engage the pins and press them to the side, locking them in place against the edges of corresponding apertures in the second and third plates.

Index means preferably are provided to engage index apertures in PCB corners and hold those corners a fixed distance from the outer surface of the uppermost, fourth, plate.

Installation operations may be performed on the exposed, second side of the PCB, such as solder paste stenciling, placing of components and soldering of component leads. The PCB may be removed and another identical board placed on the support and the component installation steps repeated.

When a series of PBS's are completed, the third plate is moved back to the position with openings aligned with openings in the second and fourth plates, releasing the pins and allowing them to be pushed to a uniformly extending position by the elastically compressible members, typically conical springs, soft rubbery foam material or the like. Another, different PCB can be pressed over the pins with board index aperture aligned with index pins and the pin locking, component installation and pin release steps can be repeated. Conical springs are preferred, configured so as to lie flat when fully compressed and providing a uniform maximum depth for the pins. Also, the springs preferably have sufficient height when uncompressed to fill the entire height of the opening.

Preferably, the base plate assembly comprises an imperforate bottom sheet with a perforated plate having the selected aperture pattern therethrough. If desire, however, the base plate assembly could be formed as a single thicker sheet with the apertures machined therein.

A first frame is preferably provided around and secured to the periphery of the base plate assembly and a second form is provided around the upper plate assembly and secured thereto. A hinge means is preferably placed along one contiguous edge of the base and upper plat assemblies to hinge them together. This permits the second frame and upper plate assembly to be pivoted away from the first from and base plate assembly to provide access to the apertures in the base plate assembly for placement and removal of the elastically compressible members, which are preferably conical compression springs. The springs preferably have an uncompressed length sufficient to fill the height of the apertures and are configured to lie flat against the bottom surface when fully compressed.

Preferably, the first from is secured to the base plate assembly (and the second from to the upper plate assembly) by placing members, such as rings or disks configured to fit snugly in selected apertures along the rows of apertures adjacent to the frame, then drilling and tapping apertures through the from into the rings for insertion of threaded bolts thereinto. Preferably, the second frame includes a narrow flange extending over the surface of the uppermost, fourth, plate to hold the upper plate assembly together.

Any suitable mechanism may be used for sliding the third plate of the upper plate assembly between the pin locked and unlocked positions. Typically, screws extending through the second frame and engaging an edge of the fifth plate may be used.

A particularly effective and preferred third plate moving mechanism consists of at least one cam mechanism which includes a short rod extending through a round opening in the fourth plate. An offset cam at the proximal end of the rod length lies in an enlarged, typically a rounded square or other suitably shaped opening in the third plate. When the rod is rotated, typically by an Allen wrench engaging a socket in the outer rod end, the cam selectively moves the third plate between pin locking and unlocking positions. For optimum latching in either position, the opening is configured to provide an over-center effect.

Index means are provided on the distal surface of the uppermost, fourth, plate for engaging conventional index apertures as generally provided in the corners of PBS'S. In a preferred embodiment, an index bar is positioned across the distal surface of the fourth plate, secured to the second frame edges. Index pins are adjustably mounted on the bar for positioning along the length of the bar to engage two adjacent board index apertures.

If desired, the edge of the PCB opposite the index bar could be supported by a simple rectangular bar having a thickness equal to the thickness of the index bar.

In a more positive index arrangement for supporting the edge of the PCB away from the index bar, at least one cam disk having a center pin sized to fit in any of the fourth board apertures and an edge pin extending in the opposite direction to engage a board index aperture may be used. The center pin is placed in a fourth plate aperture near a board aperture and the disk is rotated to bring the edge pin into engagement with the board index aperture.

BRIEF DESCRIPTION OF THE DRAWING

Details of the invention, and of preferred embodiments thereof, will be further understood upon reference to the drawing, wherein.

DETAILED DESCRIPTION OF PREFERRED EMBODIMENTS

Figure 1:
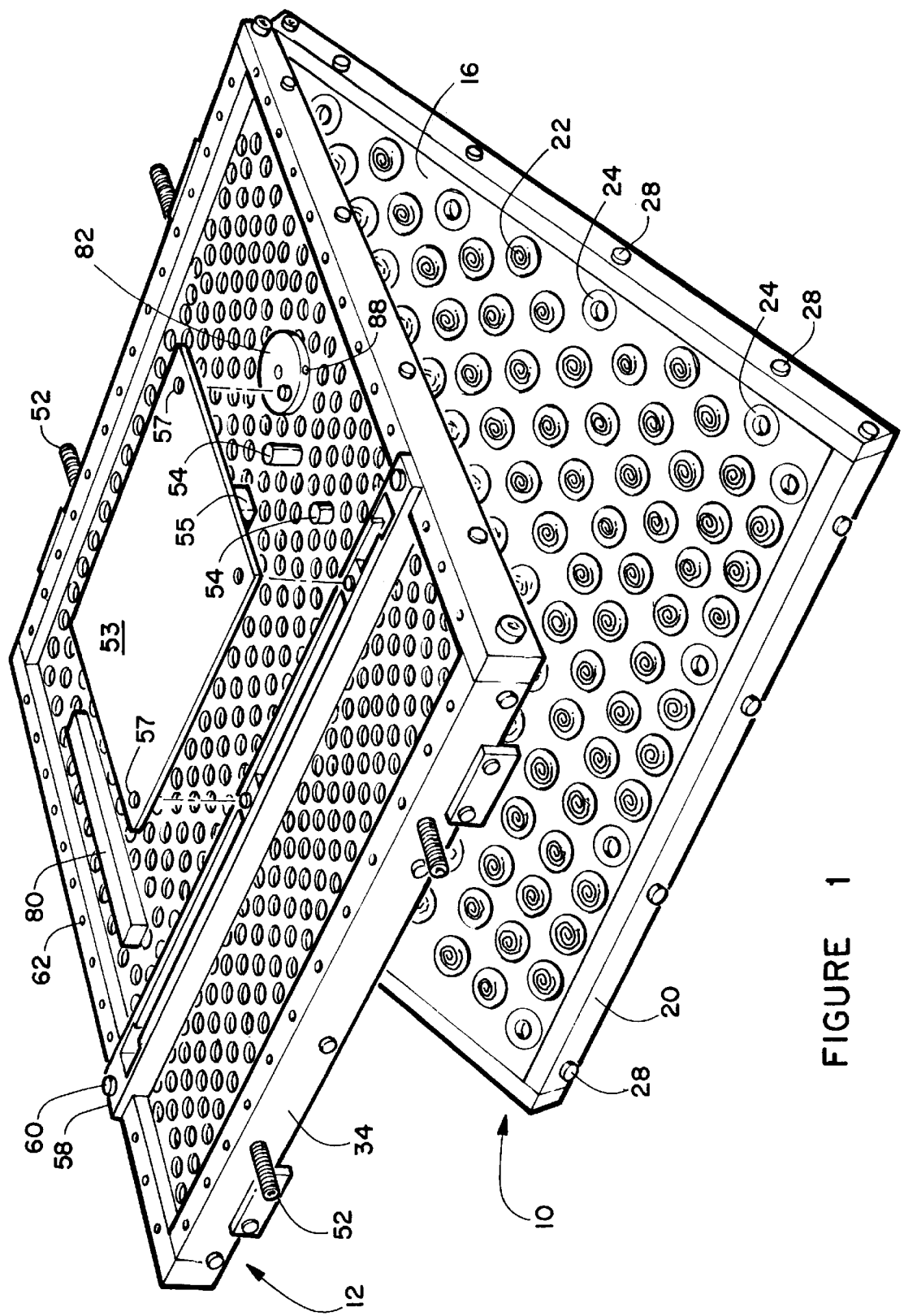
FIG. 1 is a perspective view of the PCB support assembly in the open position with a PCB in place.
Figure 2:
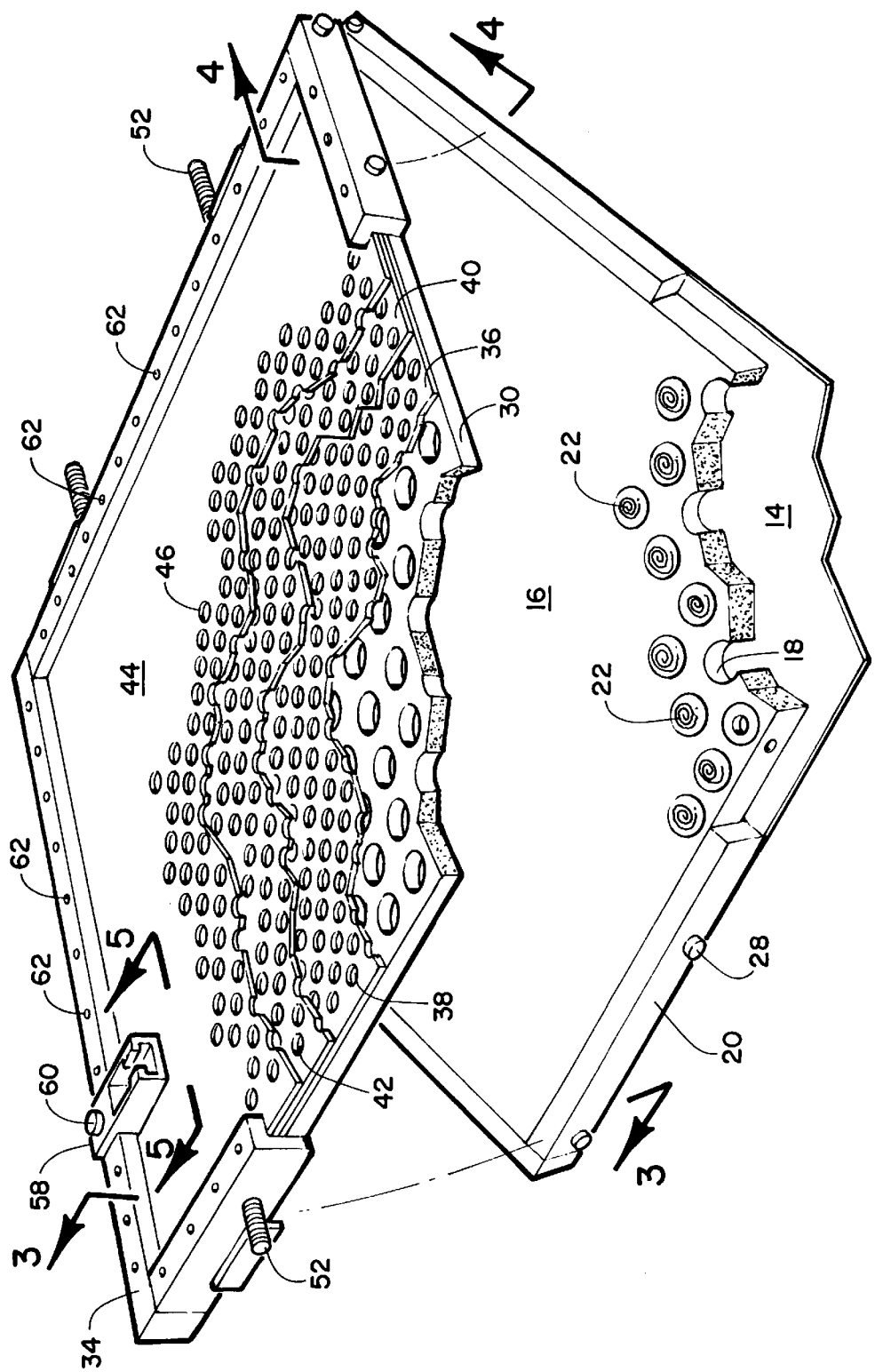
FIG. 2 is a perspective view of the PCB support assembly of FIG. 1, in the closed position with the several plates partially cut away.

Referring to FIGS. 1 and 2, there is seen an apparatus for supporting PCB's having components installed on one surface while installing other components on the opposite surface that basically includes a base plate assembly 10 and an upper plate assembly 12. A PCB with no installed components may also be supported, if desired.

Base plate assembly 10 comprises a relatively thin imperforate lower sheet 14 and a thicker upper sheet 16 having a pattern of apertures 18. A first frame 20 is secured to the periphery of sheets 14 and 16. Lower sheet 14 is secured to upper sheet 16 and/or first frame 22 in any suitable manner such as by adhesive bonding, soldering, etc. If desired, the base plate may be in the form of a single sheet 16 with recesses formed by molding, machining or the like to form closed end apertures 18.

Apertures 18 preferably are round and have diameters of about 0.3–0.4 inch, although any other suitable cross section and diameter may be used if desired. An elastically compressible member 22 is positioned in most apertures 18. Any suitable material that can be compressed and, when compressed, exerts an upwardly directed biasing force may be used. Resilient foamed plastics and metal or plastic springs are preferred. For best results, members 22 are conical or frusto-conical compression springs having a base that substantially fills the bottom surface of an aperture 18 and a relatively narrow peak.

Sheet 16 is secured to first frame 20 by a mechanism including members 24 configured to fit in at least some of the outer rows of apertures 18, adjacent to first frame 20. Where apertures 18 have circular cross sections, members are preferably rings (as illustrated) or solid disks. Holes 26 (best seen in FIG. 4) are formed, such as by drilling, through first frame 20 and into rings 24. A bolt 28 or similar threaded fastener such as a setscrew is threaded through first frame 20 and into each ring 24 to secure sheet 16 to the first frame. Any suitable number of these attachment mechanisms may be used, typically about one every 3–6 inches along first frame 20.

Upper plate assembly 12 includes a plurality of plates sandwiched together. First plate 30 is relatively thick and includes apertures 32 aligned with apertures 18 in upper sheet 16. Of course, where elastic members 22 are conical springs as shown, the diameter of apertures 32 could be somewhat less than the diameters of apertures 18. If desired, the relative thicknesses of upper sheet 16 and first plate 30 could be varied, so long as the overall combined thickness is sufficient to provide the desired room for elastic members 22 to operate and for pins to project downwardly against members 22, as detailed below.

First plate 30 is secured within peripheral second frame 34 by a plurality of rings or disks, tapped frames holes and bolts corresponding to rings 24, tapped holes 24 and bolts 28 securing first frame 20 to upper sheet 16.

A second plate 36 overlies first plate 30 and is supported by first plate 30. Second sheet 36 includes a pattern of apertures 38 having axes corresponding to the axes of apertures 18 and 32 in upper sheet 16 and first plate 30, respectively. Apertures 38 may be somewhat narrower than apertures 18 and 32, typically about 0.1 to 0.15 inch.

A third plate 40 having a surface pattern of apertures 42 basically identical to the pattern of apertures 38 in second plate 36 overlies the second plate. A fourth plate 44 having a surface pattern of apertures 46 basically identical to the pattern of apertures 38 and 42 in plate 36 and 40 overlies the third plate. Plates 36 and 44 abut second frame 34 along all edges. An edge 48 of each side of third plate 40 extends slightly into a recess 50 in the corresponding side of second frame 34.

Figure 3:
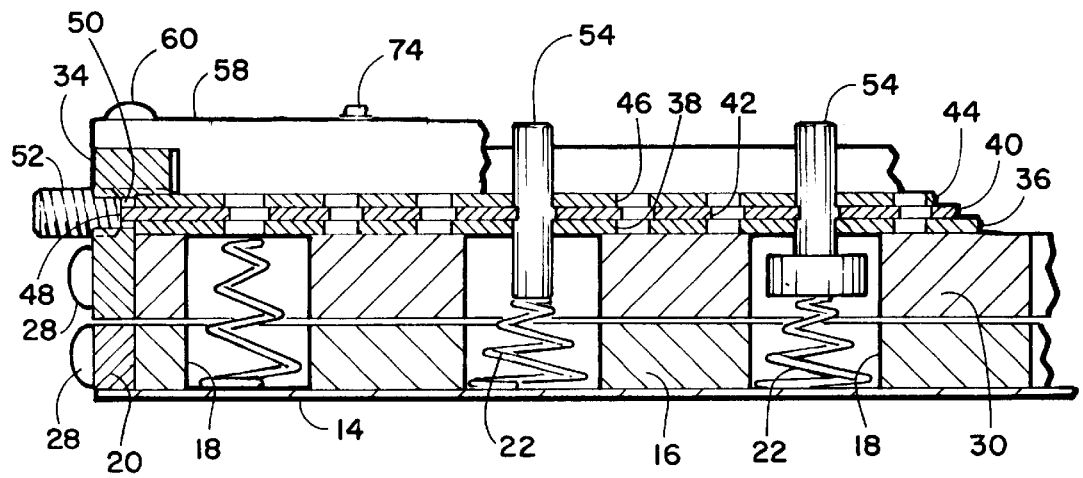
FIG. 3 is a partial section view taken on line 3—3 in FIG. 1, showing support pins in the locked position.
Figure 4:
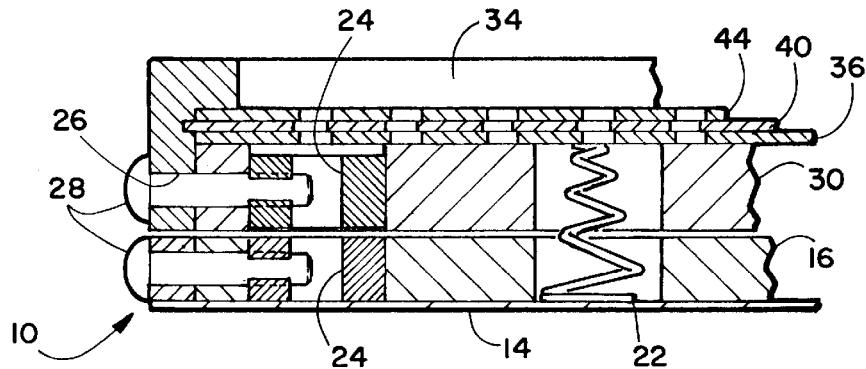
FIG. 4 is a partial section view taken on line 4—4 with the assembly closed to show the arrangement for locking plates to the frame.

At least one (preferably two) setscrew 52 extends through tapped holes in opposite sides of second frame 34 into contact with edge 48 to move third plate 40 into and out of alignment with corresponding apertures 38 and 46 in adjacent second plate 36 and fourth plate 44. As seen in FIG. 3, an edge of third plate 40 extends beyond the continuous sheets for engagement by setscrew(s) 52. FIG. 4 shows the side edges of third plate 40 slidable along grooves in frame 34.

A plurality of deformable pins, such as rubber-like pins 54 are inserted in aligned apertures through plates 1–4. Pins 54 may be formed from any suitable material having the desired friction characteristics. Excellent results are obtained with hard rubber pins, nylon pins or other harder plastics, where the harder materials have circumferential or longitudinal shallow surface grooves or serrations.

The lower ends of pins 54 rest against springs 22. A PCB having components installed on one side is pressed against the array of pins 54, with components pushing pins downwardly against springs 22 distances corresponding to the thickness of the components. If desired, a PCB with no components installed can also be placed over the array of pins for installation of components on the upper sided. The PCB could, of course, comprise any suitable substrate upon which components are to be mounted in any manner.

Then screws 52 are rotated to move third plate 40 to the clamping position shown in FIG. 3. The portion of each pin 54 adjacent to third plate 40 is distorted, locking the pin in position. Since the second, third and fourth plates are contiguous, no pin material can bulge between plates, so the pin itself is not distorted and remains vertical, so that the relationship between pin ends and PCB components is not changed.

Then, operations such as stenciling solder paste, placing components and soldering leads may be performed with a stable, level PCB without any distortion or damage to the components on the underside of the board.

While subsequent identical PCB's may simply be placed in the "nest" formed when pins 54 are locked in place with the first board, preferably indexing means is provided to precisely located each succeeding board in precisely the same position relative to the plate assembly. This can be important when components to be placed on the upper side of the PCB must be very precisely positioning for soldering in place.

As seen in FIGS. 2, 3 an 5, an index bar 58 is positioned across the distal surface of fourth plate 44. Ends of index bar 85 are configured to be secured by bolts 60 to selected ones of holes 62 in second frame 34. The thickness of index bar is preferably selected so that when a PCB having a variety of components 55 mounted on the surface to be pressed against pins 54, the thickest component will clear the distal surface of fourth plate 44. Similarly, the length of pins 54 will preferably be selected so that when a pin is pressed downwardly into aligned holes in the second, third and fourth plates, the proximal end of the pin will not quite bottom out spring or other elastic member 22.

Figure 5:
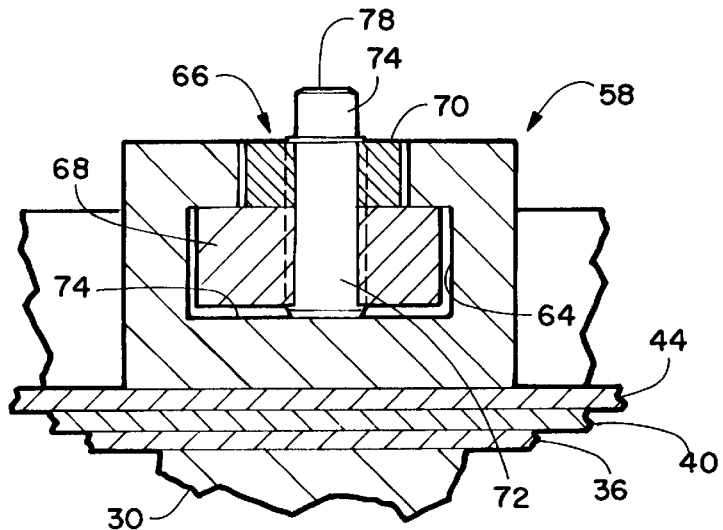
FIG. 5 is a detail transverse section through an index bar, taken on line 5—5 in FIG. 2.

As best seen in FIG. 5, index bar 58 has in inverted T-shaped lengthwise channel 64 machined therein. A traveler 66 is slidable in channel 64. Traveler 66 is made up of two blocks, a lower block 68 sized to slide in the head of the "T" shaped channel and upper block 70 slidable in the leg portion of the "T" shaped channel. A setscrew 72 is threaded through blocks 68 and 70 and, when threaded inwardly bears against channel wall 74 to lock traveler 66 at a selected location. Typically, an Allen wrench socket 78 is formed in head 76. The head 76 of setscrew 72 is sized to fit snugly in a conventional index hole in a PCB.

The index bar is assembled by sliding a lower block 68 into channel 64 and an upper block 70 into the channel from the top. Setscrew 72 is threaded into the blocks, but not against channel wall 74. While a single traveler 66 could be used, preferably two are used to engage two index holes along an edge of the PCB. Travelers 66 are adjusted so that heads 76 are emplaced in PCB index holes, then setscrews 72 are tightened.

A simple bar 80 having a thickness equal to the thickness of index bar 58 may be placed under the edge of a PCB opposite the index bar to support that edge or to support that edge when placing and adjusting pin heights to the PCB.

Figure 6:
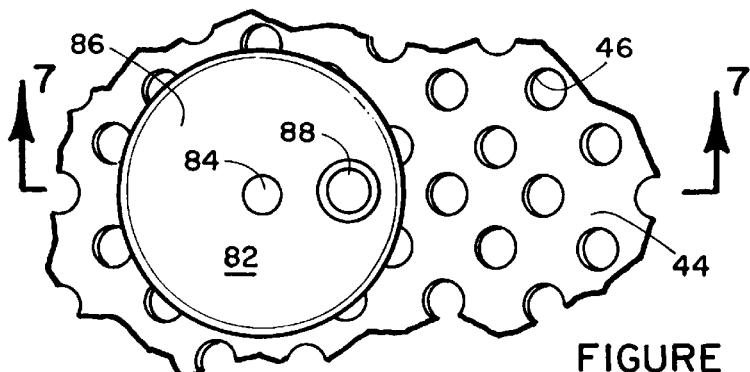
FIG. 6 is a detail plan view of the disk PCB indexing device.
Figure 7:
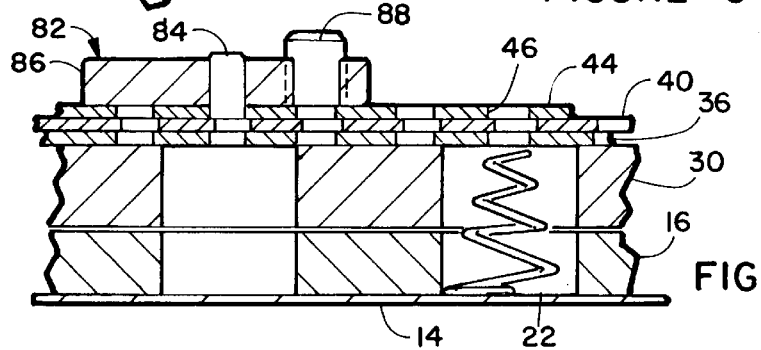
FIG. 7 is a detail section view taken on line 7—7 in FIG. 6.

For more positive support of all four corners of a typical PCB, two travelers 66 are used along index bar 58 and two rotatable supports 82, as seen in FIGS. 2, 6 and 7, are used. A central pin 84 is inserted along the axis of disk 86 and extends through the bottom. Pin 84 may be undersized so as to loosely extend through holes in apertures 46 or may have a radial recess at plate 40 as shown to allow movmement of plate 40. While any other suitable shape could be used for disk 86, a circular disk is preferred for ease of rotation. Pin is sized to fit in any of apertures 46 and is held in place by a setscrew 88 through the side of disk 86. The thickness of disk 86 matches the thickness of index bar 58. An upwardly extending edge pin 88 is provided in disk 86, typically as a setscrew threaded into the disk. The head of pin 88 is configured to fit in a conventional PCB index hole.

In use, a rotatable support 82 is placed near each index hole of a PCB that does not engage a traveler 66. Edge pin 88 is inserted in an index hole in the PCB to be supported. Disk 86 is rotated to bring central pin 84 into alignment with an appropriate aperture 46.

Figure 8:
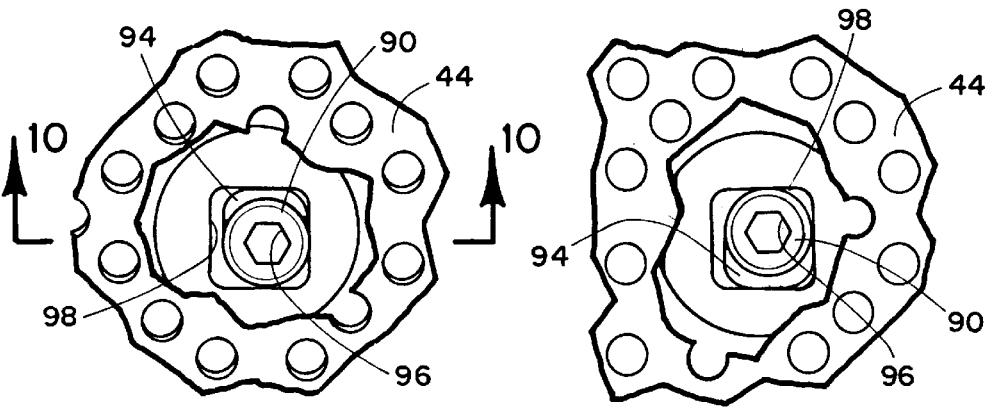
FIG. 8 is a detail plan view, partially cut away, of the cam clamping plate moving mechanism in the pin clamped position.
Figure 9:
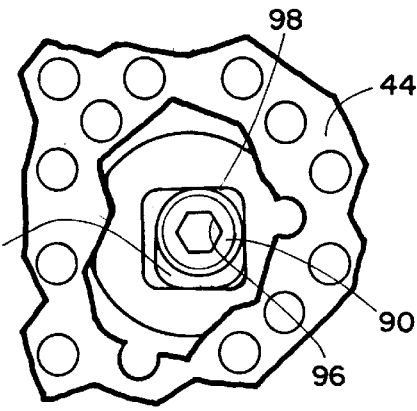
FIG. 9 is a detail plan view, partially cut away, of the cam clamping plate moving mechanism in the pin released position.
Figure 10:
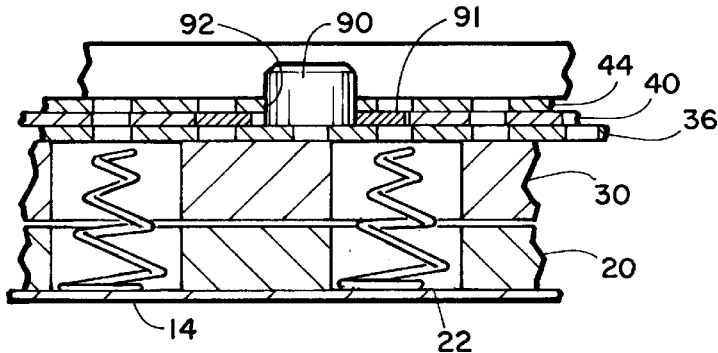
FIG. 10 is a detail section view taken on line 10'10 in FIG. 8.

An alternate embodiment of a mechanism for moving third plate 40 between the pin clamping and unclamping positions, in place of setscrews 52, is illustrated in FIGS. 8–10.

A short rod 90 extends through a round opening 92 in fourth plate 44. The distal end of rod 90 extends into a hole in plate 36. An offset cam member 94 is provided at the proximal end of rod 90 in an opening 98 in third plate 40. A means, such as a socket 96 for an Allen wrench, is provided in the distal end of rod 90 so that the rod can rotate cam 94 relative to third sheet. The opening 98 is configured so that rotating cam 94 in one direction will move third plate 40 to the position in which deformable pins 54 are clamped and rotating the cam 180° in the opposite direction will unclamp the pins. For best results, the cam will be in a latching position until released. The generally square configuration of opening 92 with rounded corners is effective, since the cam when fully rotated in either direction will be slightly over-center.

While certain specific relationships, materials and other parameters have been detailed in the above description of preferred embodiments, those can be varied, where suitable, with similar results. Other applications, variations and ramifications of the present invention will occur to those skilled in the art upon reading the present disclosure. Those are intended to be included within the scope of this invention as defined in the appended claims.

I claim:

1. Apparatus for supporting a substrate having components installed on one side while installing components on the opposite side, which comprises:

a base plate assembly having a plurality of uniform recesses across a distal surface in a predetermined recess pattern;

an elastically compressible element positioned in at least some of said base plate assembly recesses;

an upper plate assembly comprising:

a first, proximal, plate having a plurality of uniform apertures in a pattern corresponding to said recess pattern;

a second plate overlying said first plate and having a plurality of uniform apertures in a pattern corresponding to said recess pattern;

a third plate overlying said second plate and having a plurality of uniform apertures in a pattern and aperture configuration corresponding to said second plate aperture pattern;

a fourth plate overlying said third plate and having a plurality of uniform apertures in a pattern and aperture configuration corresponding to said second plate aperture pattern;

means for moving said third plate between an aligned position in which said apertures in said second, third and fourth plates are aligned and a clamping position in which said third plate is not aligned with said second and fourth plate apertures;

a plurality of deformable pins for insertion into at least some of said apertures in said second, third and fourth plates when said apertures are aligned, said pins having cross sections corresponding to said second, third and fourth plate apertures.

2. The apparatus according to claim 1 wherein said recesses and said apertures in said first plate are generally round and have substantially equal diameters and said apertures in said second, third and fourth plates are round and of equal diameter and less than said recess and first plate apertures.

3. The apparatus according to claim 1 wherein said pins are formed from a deformable material having a hardness of from about 75 to 90 on the Shore A scale.

4. The apparatus according to claim 1 further including a first peripheral frame secured around said base plate assembly and a second peripheral frame secured around said upper plate assembly.

5. The apparatus according to claim 4 further including:

means for securing said base plate assembly to said first peripheral frame which comprises a plurality of first members configured to fit in said base plate recesses, threaded holes extending through said first peripheral frame and into said first members and correspondingly threaded bolts for threading through said first peripheral frame and into said first members;

means for securing said first plate to said second peripheral frame which comprises a plurality of second members configured to fit in said first plate apertures, threaded holes extending through said second peripheral frame and into said second members and correspondingly threaded bolts for threading through said second peripheral frames and into said second members; and hinge means fastened to an edge of said first peripheral frame and edge of said second peripheral edge to permit said second frame to be rotated about said hinge relative to said first frame and provide access to said recesses.

6. The apparatus according to claim 1 wherein said means for moving said third plate comprises at least one bolt threaded through a hole in said second frame and having a distal end engaging an edge of said third plate between aligned and clamping positions.

7. The apparatus according to claim 1 wherein said means for moving said third plate comprises at least one rod extending through aligned apertures in said third and fourth plates, said rod receiving aperture in said third plate being enlarged and an offset cam member on said rod within said enlarged aperture so that rotation of said rod will bring said cam surface into engagement with a wall of said enlarged aperture to selectively move said third plate between aligned and clamping positions.

8. The apparatus according to claim 1 further including substrate index means comprising:

a bar extending across the distal surface of said fourth plate and secured to said second frame at a predetermined position;

at least one index pin member configured to fit in an index hole in a substrate;

said index pin member being fastenable to said bar at a predetermined position along said bar to index said substrate first index hole at a predetermined position relative to said frame and a predetermined height above said fourth plate distal surface; and edge support means for supporting an edge of a said substrate distant from said first index hole at said predetermined height.

9. The apparatus according to claim 8 wherein said distant edge support means comprises a rectangular cross section bar for positioning under said distant edge.

10. The apparatus according to claim 8 wherein said distant edge support means comprises at least one disk having an edge disk pin on a distal disk surface for insertion in a substrate index hole adjacent to said distant edge and a central disk pin extending from a proximal disk surface for insertion into a fourth plate aperture, and said disk thickness is configured to support said substrate at said predetermined height; whereby said disk is rotatable to mutually align said edge disk pin with a circuit board index hold and said central disk pin with a fourth plate aperture.

11. Apparatus for supporting a substrate while installing components on the a side, which comprises:

a base plate assembly having a plurality of uniform recesses across a distal surface in a predetermined recess pattern;

an elastically compressible element positioned in at least some of said base plate assembly recesses;

an upper plate assembly comprising:

a first, proximal, plate having a plurality off uniform apertures in a pattern corresponding to said recess pattern;

a second plate overlying said first plate and having a plurality of uniform apertures in a pattern corresponding to said recess pattern;

a third plate overlying said second plate and having a plurality of uniform apertures in a pattern and aperture configuration corresponding to said second plate aperture pattern;

a fourth plate overlying said third plate and having a plurality of uniform apertures in a pattern and aperture configuration corresponding to said second plate aperture pattern;

means comprises a rotatable rod extending through openings in said third and fourth plates and a cam means in said opening in said third plate and mounted on said rod for moving said third plate between an aligned position in which said apertures in said second, third and fourth plates are aligned and a clamping position in which said third plate is not aligned with said second and fourth plate apertures;

a plurality of deformable pins for insertion into at least some of said apertures in said second, third and fourth plates when said apertures are aligned, said pins having cross sections corresponding to said second, third and fourth plate apertures; and index means for maintaining a substrate parallel to and at a predetermined distance above said fourth plate and for engaging index holes on a substrate to position said board adjacent a predetermined location along said fourth plate.

12. The apparatus according to claim 11 wherein said recesses and said apertures in said first plate are generally round and have substantially equal diameters and said apertures in said second, third and fourth plates are round and of equal diameter and less than said recess and first plate apertures.

13. The apparatus according to claim 11 wherein said pins are formed from a material selected from the group consisting of deformable material having a hardness of from about 75 to 90 on the Shore A scale and nylon having surface serrations.

14. The apparatus according to claim 11 further including a first peripheral from secured around said base plate assembly and a second peripheral frame secured around said upper plate assembly.

15. The apparatus according to claim 14 further including:

means for securing said base plate assembly to said first peripheral frame which comprises a plurality of first members configured to fit in said base plate recesses, threaded holes extending through said first peripheral frame and into said first members and correspondingly threaded bolts for threading through said first peripheral frame and into said first members;

means for securing said first plate to said second peripheral frame which comprises a plurality of second members configured through said second peripheral frame and into said second members and correspondingly threaded bolts for threading said second peripheral from and into said second members; and hinge means fastened to an edge of said first peripheral frame and edge of said second peripheral edge to permit said second frame to be rotated about said hinge relative to said first frame and provide access to said recesses.

16. The apparatus according to claim 11 wherein said substrate index means comprising:

a bar extending across the distal surface of said fourth plate and secured to said second frame at a predetermined position;

at least one index pin member configured to fit in an index hole in a substrate;

said index pin member being fastenable to said bar at a predetermined position along said bar to index said substrate first index hole at a predetermined position relative to said frame and a predetermined height above said fourth plate distal surface; and edge support means for supporting an edge of a said substrate distant from said first index hole at said predetermined height.

17. The apparatus according to claim 16 wherein said distant edge support means comprises a rectangular cross section bar for positioning under said distant edge.

18. The apparatus according to claim 16 wherein said distant edge support means comprises at least one disk having an edge disk pin on a distal disk surface for insertion in a substrate index hole adjacent to said distant edge and a central disk pin extending from a proximal disk surface for insertion into a fourth plate aperture, and said disk thickness is configured to support said substrate at said predetermined height; whereby said disk is rotatable to mutually align said edge pin with a circuit board index hole and said central disk pin with a fourth plate aperture.

* * * * *